(12) United States Patent
Schulz-Harder

(10) Patent No.: US 6,182,358 B1
(45) Date of Patent: Feb. 6, 2001

(54) PROCESS FOR PRODUCING A METAL-CERAMIC SUBSTRATE

(76) Inventor: Jurgen Schulz-Harder, Hugo-Dietz-Strasse 32, D-91207 Lauf (DE)

(*) Notice: Under 35 U.S.C. 154(b), the term of this patent shall be extended for 0 days.

(21) Appl. No.: 08/665,967

(22) Filed: Jun. 21, 1996

Related U.S. Application Data

(63) Continuation of application No. 08/253,245, filed on Jun. 2, 1994, now abandoned.

(30) Foreign Application Priority Data

Jun. 3, 1993 (DE) .................................................. 43 18 463

(51) Int. Cl.[7] .................................................... H01R 43/16
(52) U.S. Cl. ................................................ 29/846; 29/847
(58) Field of Search ........................... 29/846, 847, 874; 174/261, 262, 266; 361/777, 778

(56) References Cited

U.S. PATENT DOCUMENTS

| | | | |
|---|---|---|---|
| 3,487,541 | * 1/1970 | Boswell | 174/261 |
| 4,295,184 | * 10/1981 | Roberts | 174/262 |
| 4,500,029 | * 2/1985 | Yerman . | |
| 4,527,330 | * 7/1985 | Sturm et al. | 29/827 |
| 4,737,236 | * 4/1988 | Perko et al. | 29/846 |
| 4,831,723 | * 5/1989 | Kaufman | 29/827 |
| 5,029,386 | * 7/1991 | Chao et al. | 29/827 |
| 5,353,499 | * 10/1994 | Hattori et al. | 29/846 |

FOREIGN PATENT DOCUMENTS

| 4004844 | 3/1991 | (DE) . |
|---|---|---|
| 3931551 | 4/1991 | (DE) . |

* cited by examiner

*Primary Examiner*—P. W. Echols
(74) *Attorney, Agent, or Firm*—Hoffman Wasson & Gilter PC

(57) ABSTRACT

A process is provided in which an initial substrate has a ceramic layer with metal layers on either side. At least one of the metal layers projects above one edge of the ceramic layer. The projecting sub-area is deformed so that the metal layer on the edge is disposed a distance from the surface of the ceramic layer, and along the edge in one border area with a stipulated width is separated from the ceramic layer.

16 Claims, 4 Drawing Sheets

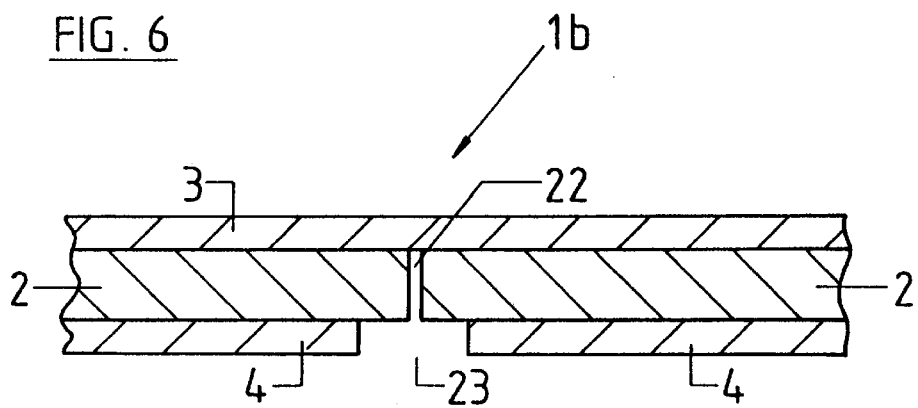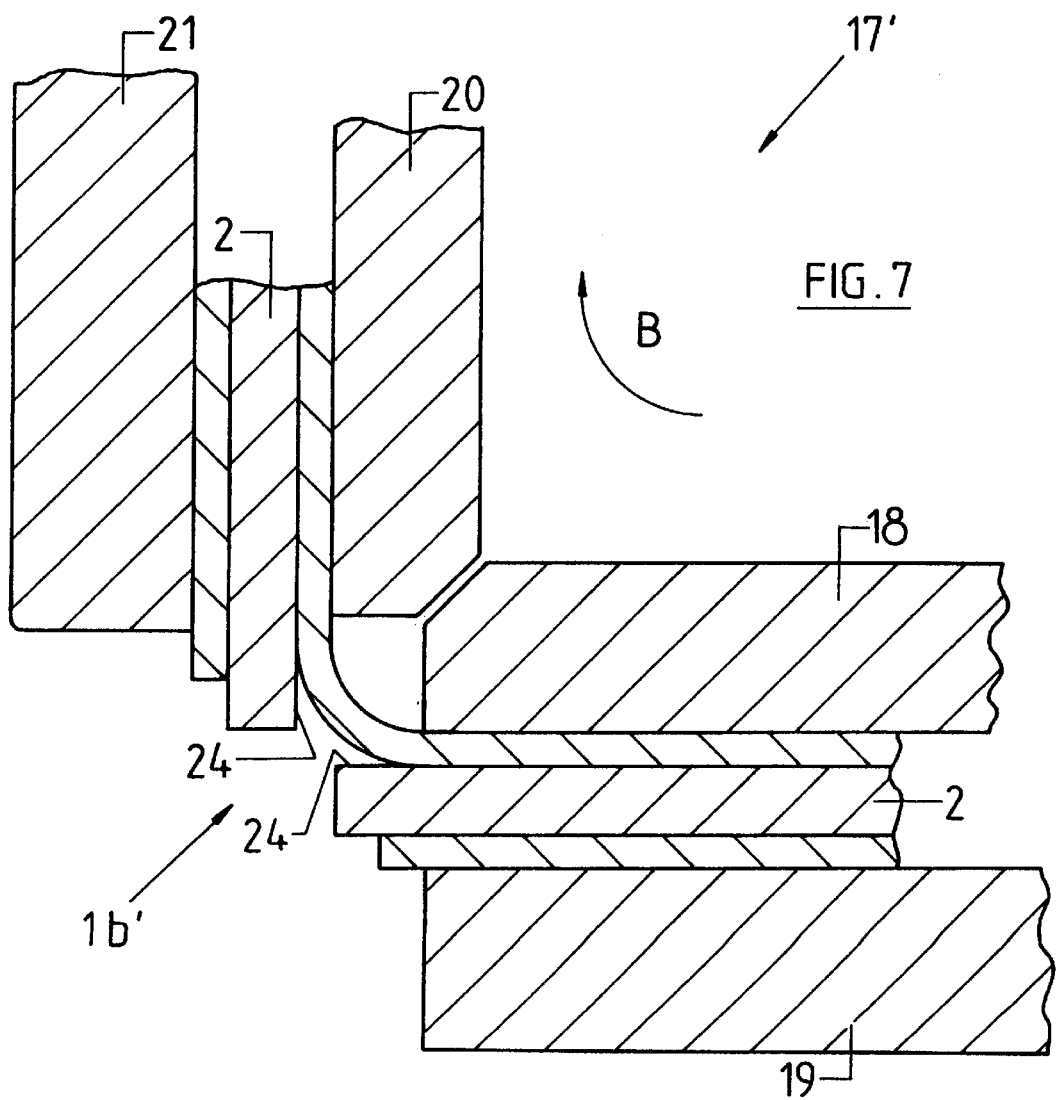

PROCESS FOR PRODUCING A METAL-CERAMIC SUBSTRATE

This application is a continuation of application Ser. No. 08/253,245 filed on Jun. 2, 1994, now abandoned.

BACKGROUND OF THE INVENTION

Metal-ceramic substrates and especially also copper-ceramic substrates are known in the most varied versions and are used in particular for electrical or electronic circuits and thus especially for power circuits (power modules).

In the simplest case these substrates consist of a single ceramic layer which is provided on both surface sides with metallic coating or a metal layer and thus preferably with a copper layer, the metal layer on the one surface side of the ceramic layer being preferably configured, i.e., forming printed conductors and/or contact surfaces, etc., of which during operation of the electrical circuit at least one part has a voltage potential which is different from the voltage potential of the other metal layer on the other surface side of the ceramic layer. By means of the ceramic layer fundamentally a relatively high dielectric strength between the metal layers on the surface sides of the ceramic layer is ensured. However, often these metal-ceramic substrates in certain areas are also often formed such that the metal layers on the two surface sides of the ceramic layer, for example, on the edge of the ceramic layer or in the area of the recesses, openings, interruptions, etc. provided in this ceramic layer are electrically separated from one another only on an air path along the edge of the ceramic layer so that sufficient dielectric strength or sufficient insulation distance between the metal layers cannot be achieved there on the two surface sides of the ceramic layer for higher voltages. Furthermore, cracking occurs preferably at these points, especially when the substrates are subjected to repeated temperature changes. Cracking is caused by the corresponding mechanical stresses which are the result of different coefficients of expansion.

Generally, in these cases the dielectric strength is improved by using insulating compounds. In existing metal-ceramic substrates, dielectric strengths cannot be reached which are sufficient for higher voltages, i.e. for voltages, for example, higher than 1000 V. Occurrence of thermomechanically induced cracks cannot be prevented in this way.

It addition, it is also known that ceramic-metal substrates are produced by attaching (U.S. Pat. No. 4,500,029) metal foils or metal boards flat for forming metal layers on the surface side of the ceramic layer by means of the so-called direct bonding process (DB process) or eutectic bonding process, in which it is also known in these substrates that a metal layer is formed on one surface side of the ceramic layer in at least one sub-area in the manner of a bridge, such that this metal layer has a distance from the plane of the pertinent surface side of the ceramic layer there. A printed conductor provided on the same surface side of the ceramic layer is routed through the bridge-like section or area in this known configuration of a metal-ceramic substrate.

In addition, attaching a metal strip on the top of a ceramic layer by means of the DB method so that this strip projects with a sub-area above the border of the ceramic layer is also known (DE 25 08 224). The metal strip is first oxidized on one surface side for this purpose. The oxide is then removed on the sub-area with which the metal strip will project above the edge of the ceramic layer. Then the metal strip with its remaining oxidized surface side is placed on the ceramic layer and then by heating the ceramic layer and metal strip to a process temperature which exceeds the eutectic temperature of the metal oxide, but which is below the melting point of the metal of the metal strip, the bond is produced.

SUMMARY OF THE INVENTION

The problem of the invention is to devise a process for producing a metal-ceramic substrate which has improved dielectric strength or improved insulation spacing in those areas in which at least one of the metal layers provided on a ceramic layer projects above one border or one edge of the ceramic layer, and prevents formation of thermomechanically induced cracks.

To solve this problem, a process is devised in which an initial substrate is deformed so that a metal layer has an edge disposed a distance from one surface of a ceramic layer and the edge is raised over a border area of predetermined width from the ceramic layer.

In the process according to the invention an initial substrate is first produced which has at least one ceramic layer and on the surface sides of this ceramic layer one metal layer each, at least one metal layer provided on one surface side of the ceramic layer projecting above one edge of the ceramic layer. In a subsequent process step then this projecting sub-area of at least one metal layer is permanently mechanically deformed such that the metal layer on the edge is at a distance from the surface side of the ceramic layer and along the edge in one border area with a stipulated width. This selective and precisely controlled deformation and separation of the metal layer from the ceramic layer greatly increase the distance decisive for the insulation resistance and dielectric strength between the one metal layer on one surface side of the ceramic layer and the other metal layer on the other surface side of the ceramic layer and thus greatly improve dielectric strength, especially in ceramic layers as are used conventionally for producing metal-ceramic substrates for electrical circuits.

In order to remove metal residues which may be adhering on the ceramic or ceramic layer the substrate is treated after deformation of at least one metal layer or sub-area of this metal layer in a suitable etching agent. For copper a solution of 10% sodium persulfate in 10% sulfuric acid is suitable as the etching agent, for example.

BRIEF DESCRIPTION OF THE DRAWINGS

The invention is detailed below using the figures on examples of embodiments.

FIGS. 6 and 7 show another possible version in a representation similar to FIGS. 4 and 5.

DETAILED DESCRIPTION OF THE PREFERRED EMBODIMENTS

Figure 1:
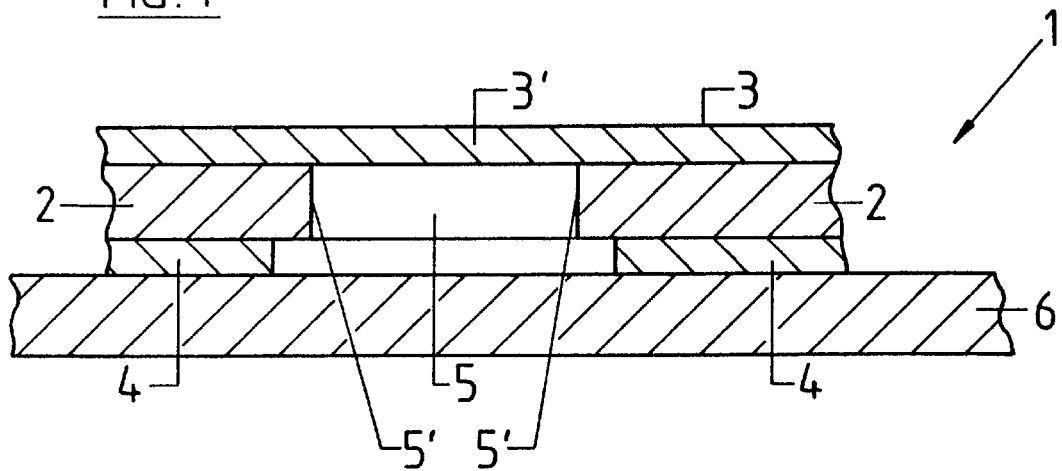
FIG. 1 shows in a simplified partial representation and in cross section an initial copper-ceramic substrate.
Figure 2:
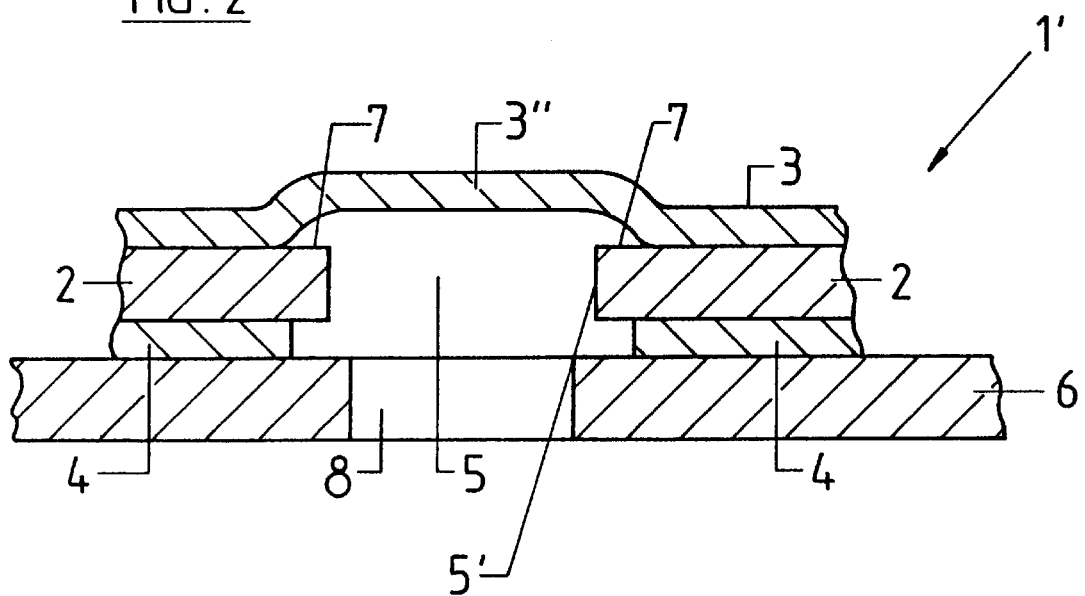
FIG. 2 shows in the same representation as FIG. 1 the copper-ceramic substrate after its completion.
Figure 3:
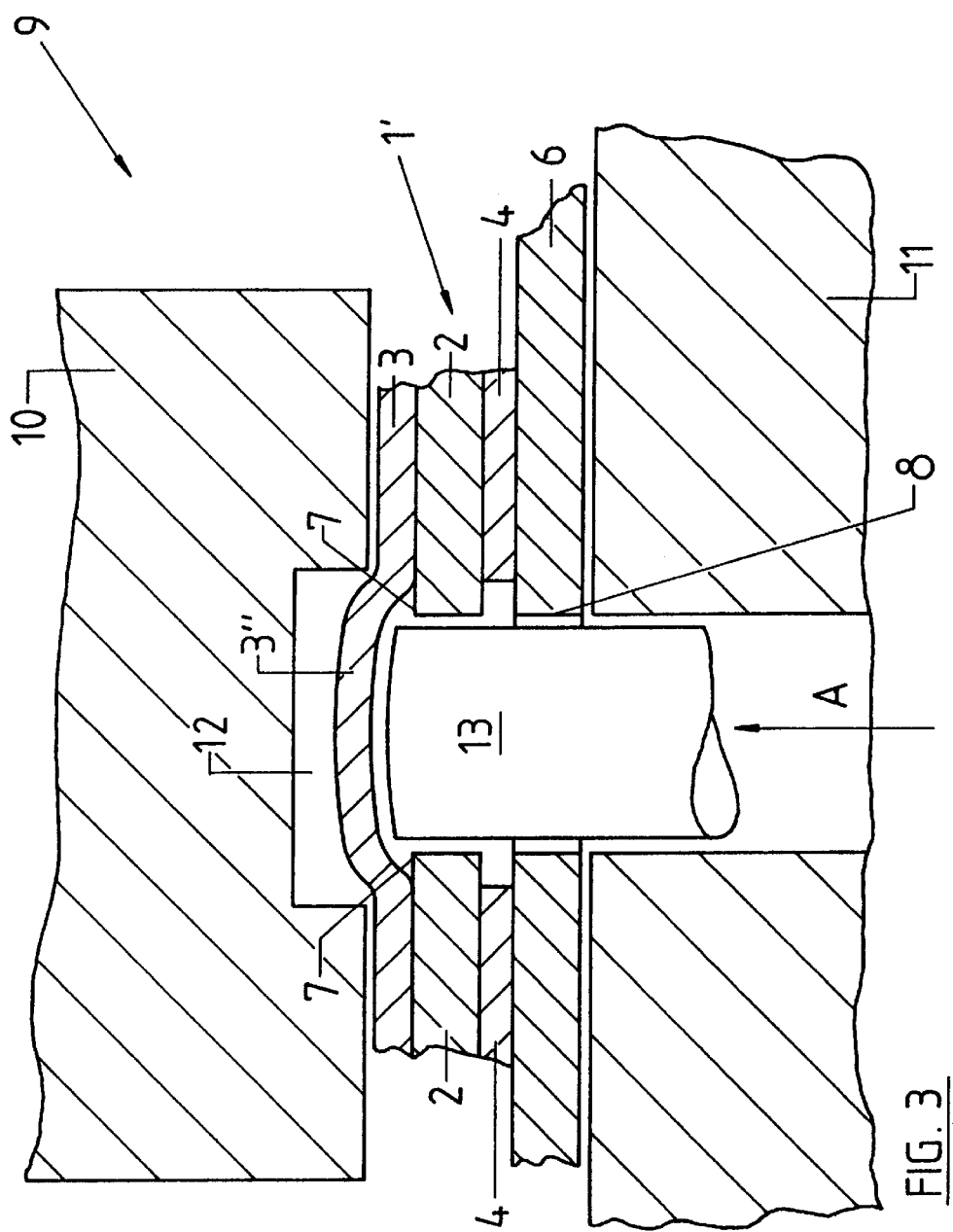
FIG. 3 shows the initial copper-ceramic substrate of FIG. 1 together with the tool for forming this substrate into the substrate of FIG. 2, FIGS. 4 and 5 show in a simplified partial representation and in cross section another initial copper-ceramic substrate immediately before its final completion or after its final completion, and together with the forming tool.

Initial copper-ceramic substrate 1 shown in FIG. 1 consists essentially of ceramic layer 2 which is provided on both surface sides each with a metallic coating in the form of copper layer 3 or 4 which is a metal foil or metal board. At 5 ceramic layer 2 as well as copper layer 4 which is the bottom one in FIGS. 1–3 are interrupted. This interruption 5 is produced, for example, by removing both the material of copper layer 4 and the material of ceramic layer 2 in the area of the interruption or opening 5 after applying copper layers 3 and 4 to ceramic layer 2.

Application of copper layers 3 and 4 to ceramic layer 2 takes place with the so-called direct bonding process (DB process) which is known from the literature to one skilled in the art and which, especially in the production of copper layers, is also called the direct copper bonding process (DCB process). Preferably structured copper layer 3 which forms printed conductors and contact surfaces bridges opening 5 with sub-area 3'. The side of bottom copper layer 4 facing away from copper layer 3 is joined to copper plate 6 (support plate) which has a thickness which is much greater compared to copper layers 3 and 4 and via which substrate 1 or the power circuit formed by this substrate and electrical components which are not shown are attached to a heat sink for dissipating heat loss which is not shown.

As the Figures show, opening 5 in the area of copper layer 4 has a greater width than in the area of ceramic layer 2 so that viewed from copper layer 3 the border of copper layer 4 in the area of recess 5 lies hidden behind the border of ceramic layer 2, the border directly delimiting opening 5 and thus the distance decisive for electrical insulation between copper layers 3 and 4 is enlarged. Then, when substrate 1 is used in circuits in which higher voltages, for example, voltages of 1000 volts or more occur, but especially also with consideration of the thickness of the ceramic layers or plates available for production of copper-ceramic substrates, the distance between copper layers 3 and 4 require for the electrical insulation in the aforementioned manner cannot be attained in the area of opening 5 even if this opening is filled with an insulating mass which ensures higher dielectric strength than air.

To increase the dielectric strength of opening 5 between copper layer 3 which bridges this opening and copper layer 4, but also copper plate 6 and to prevent thermomechanically induced cracks, in substrate 1' of FIG. 2 copper layer 3 in the area of bridge 3' is arched upwards and forms bridge 3" such that in this way not only is the distance between bridge 3" and copper layer 4 or 6 increased, but the copper of copper layer 3 is separated on the two sides of bridge 3" in one border area 7 from the side of ceramic layer 2 facing away from copper layer 4. In this way therefore especially the path or distance decisive for the dielectric strength between copper layers 3 and 4 along ceramic layer 2 or border 5' of opening 5 is greatly increased by the width of the separated border areas 7. By shifting the copper-ceramic transition area from ceramic border 5' away into the flat area thermomechanically induced cracks are prevented.

To transform substrate 1 into substrate 1' which, compared to substrate 1, has a much higher dielectric strength and reduced susceptibility to cracking during temperature cycles, through hole 8 is made first in copper plate 6 which, for example is joined by brazing to copper plate 4 in the area of opening 5. Subsequently substrate 1 is inserted into tool 9 which has two plate-shaped tool parts 10 and 11. Between the latter, substrate 1 is clamped flat so that it rests flat with its upper copper layer 3 against one surface of female die-like tool part 10 and flat against one surface of tool part 11 with copper plate 6. Tool part 10 on this bearing surface where arched bridge 3" is to be produced has a concave recess 12. In tool part 11 is male die 13 which can move perpendicularly to the bearing surface of this tool part such that this die can be moved forward from an initial position through hole 8 into opening 12 and thus for substrate 1' clamped in the tool the material of sub-area 3' is pressed by male die 13 into recess 12 and thus arched bridge 3" is formed. Recess 12 has a width which is greater than the corresponding width of opening 5 in ceramic layer 2 so that when sub-area 3' is deformed into bridge 3" at the same time, the copper of copper layer 3 is detached at the same time also from the top of ceramic layer 2 on border areas 7 in each case. The width of these areas or the detachment can be determined very exactly by the width of recess 12.

Figure 4:
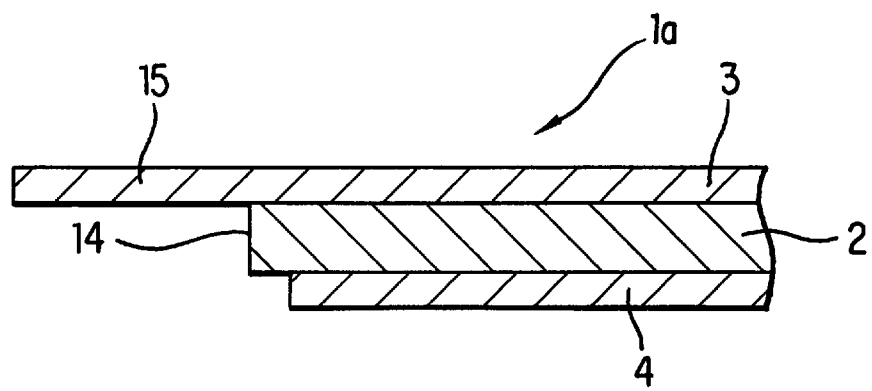
Figure 5:
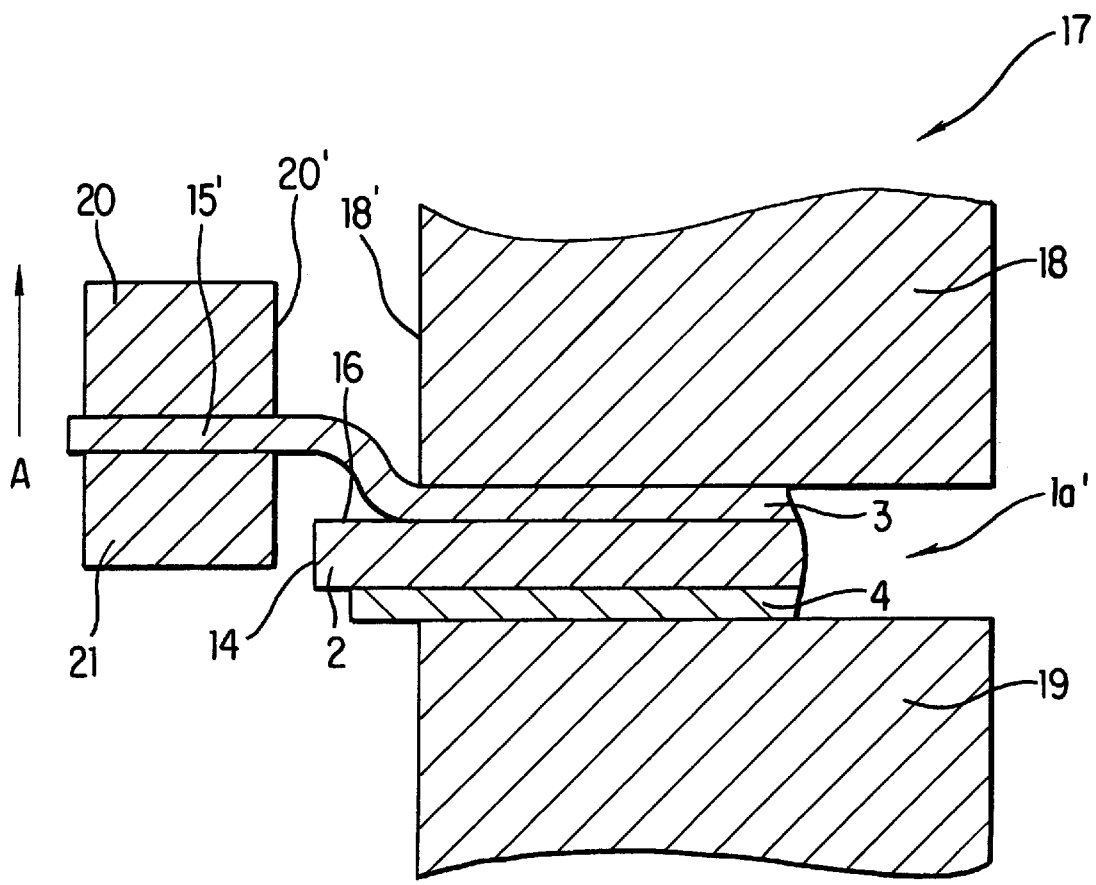

FIGS. 4 and 5 show substrate 1a or 1a', in which substrate 1a' is produced by mechanical forming from substrate 1a and has higher dielectric strength and reduced tendency to cracking.

In particular, substrate 1a which is shown like substrate 1a' in the area of one border consists of ceramic layer 2 and upper and lower copper layer 3 and 4. The upper copper layer which in turn is structured to form printed conductors, contact surfaces, etc. forms on border 14 of the substrate a projecting flap or projection 15 which is, for example, an external connection of the electrical circuit. To increase the dielectric strength between copper layers 3 and 4 or between border 14 and copper layer 4 the latter is set back with its border opposite the border of ceramic layer 2 so that for substrate 1a a distance decisive for dielectric strength results between copper layers 3 and 4 which is somewhat greater than the thickness of ceramic layer 2 and moreover a reduced tendency to thermomechanically induced cracking is obtained. At higher voltages this distance however is not adequate. To increase the dielectric strength substrate 1a is formed into substrate 1a' in which instead of projection 15, projection 15' is formed and copper layer 3 in the area of border 14 is deformed in an S-shape such that projection 15' has a greater distance from the plane of copper layer 4 not only in the direction of the vertical substrate plane, but on border 14 copper layer 3 is also detached in one edge area 16 from ceramic layer 2, in this way therefore the distance decisive for dielectric strength between copper layers 3 and 4 along ceramic layer 2 is significantly increased.

Forming tool 17 which has a total of four tool parts 18 and 19 or 20 and 21 which are each provided in pairs and which are shaped like clamps is used to shape substrate 1a into substrate 1a' with higher dielectric strength and reduced tendency to thermomechanically induced cracking. For shaping, substrate 1a is clamped between tool parts 18 and 19, tool part 18 lying flat against copper layer 3 and tool part 19 lying flat against copper layer 4 and at least tool part 18 with its border 18' which runs parallel to border 14 having a certain distance from border 14 of substrate 1a or ceramic layer 2. This distance then determines the width of detached area.

Between tool parts 20 and 21 projection 15 is clamped flat. After clamping substrate 1a in tool 17, two tool parts 20 and 21 are moved forward by a stipulated stroke in the axial direction perpendicularly to the substrate plane (arrow A) such that not only is copper layer 3 deformed in an S-shape on its transition to projection 15, but is lifted also in its area which is not supported by tool part 18 off ceramic layer 2.

FIGS. 6 and 7 show substrate 1b and substrate 1b' obtained therefrom by shaping.

Substrate 1b consists of ceramic layer 2 which is continuously slotted at 22 or is provided with a predetermined breaking point, for example, by laser cutting, by mechanical scratching or similar techniques. In ceramic layer 2 are upper and lower copper layer 3 or 4 in turn, lower copper layer 4 being interrupted in the area of the slot or predetermined breaking point 22.

By means of forming tool 17' which corresponds to tool 17 and which in turn has tool parts 18–21, substrate 1b is shaped into substrate 1b' (FIG. 7). For this reason the substrate is clamped flat between tool parts 20 and 21 with its part formed in FIGS. 6 and 7 to the right of predetermined breaking point 22 between tool parts 18 and 19 and with its part to the left of predetermined breaking point 22. The two tool parts 20 and 21 are then swivelled relative to tool parts 18 and 19, according to arrow B of FIG. 7 by roughly 90° around an axis which lies roughly in the area of predetermined breaking point 22 and which runs perpendicular to the plane of this figure such that substrate lb forms two sections bent relative to one another and each are formed by one side of bent copper layer 3 which holds these sections together, part of ceramic layer 2 and part of copper layer 4. The side of copper layer 3 facing away from ceramic layer 2 is turned to the angular space formed by the bend.

During bending upper copper layer 3 is simultaneously detached on both sides of predetermined breaking point 22 in area 24 from ceramic layer 2. The width of area 24 can in turn be exactly adjusted by adjusting the distance between borders 18' or 20' of tool parts 18 and 20, which are facing predetermined breaking point 22, and predetermined breaking point 22.

The invention was described above using examples of embodiments. It goes without saying that changes or modifications are possible without departing from the inventive idea underlying the invention.

| List of reference numbers | |
|---|---|
| 1, 1' | Substrate |
| 1a, 1a' | Substrate |
| 1b, 1b' | Substrate |
| 2 | Ceramic layer |
| 3 | Copper layer |
| 3' | Sub-area |
| 3" | Bridge |
| 4 | Copper layer |
| 5 | Opening |
| 5' | Border |
| 6 | Copper plate |
| 7 | Area |
| 8 | Hole |
| 9 | Tool |
| 10, 11 | Tool part |
| 12 | Recess |
| 13 | Male die |
| 14 | Border |
| 15, 15' | Projection |
| 16 | Area |
| 17 | Tool |
| 18–21 | Tool part |
| 18', 20' | Border |
| 22 | Predetermined breaking point |
| 23 | Interruption |
| 24 | Area |

What is claimed is:

1. A process for producing a ceramic-metal-substrate having a ceramic layer (2) with two metal layers (3, 4), one each disposed on each surface side of said ceramic layer which forms at least one edge (5', 14) over which one of said two metal layers projects with a sub-area, with said one of said two metal layers being a metal foil attached to said ceramic layer (2) and with said at least one edge being formed by an opening through said ceramic layer (2) and the other of said two metal layers, comprising the steps of:

forming an initial substrate (1, 1a, 1b) by applying said two metal layers (3, 4) on said ceramic layer (2);

clamping said initial substrate (1, 1a, 1b) between a first pair of tool parts (10, 11; 18, 19) of a deformation tool at least in an area of said edge of said ceramic layer such that one of said first pair of tool parts (10, 18) rests against a surface side of said one of said two metal layers (3) facing away from said at least one ceramic layer (2), by a distance from said edge (5, 14), said distance corresponding to a width of a border area (7) along said edge;

deforming permanently said one metal layer by a tool acting on said sub-area such that in said border area (7) of predetermined width along said edge, said one of said two metal layers (3) is bent away from said ceramic layer (2) and disposed a distance from said one surface side of said ceramic layer (2) and is raised over said one surface side of said ceramic layer, in said border area (7) of predetermined width along said edge.

2. A process according to claim 1, wherein said tool (9) is a stamping tool, and one tool part of said pair is a female die with an opening (12), and wherein said sub-area (3') is deformed after clamping of said initial substrate (1) by pressing into said opening (12) of said one tool part (10) by means of a male die (13) of said stamping tool.

3. A process as recited in claim 1, wherein a female-die (10) is one of said tool parts supporting said initial substrate on said one metal layer (3).

4. A process as recited in claim 1 further comprising the steps of:

producing said initial substrate (1) so that said ceramic layer (2) has an interruption formed as an opening through said ceramic layer (5), said interruption being bridged by said sub-area (3') of said one metal layer (3), wherein a second of said two metal layers (4) has an interruption formed therein, in an area of said interruption (5) of said ceramic layer (2), and wherein borders of said interruption in said ceramic layer (2) form said edge (5'), and deforming said sub-area (3') such that said sub-area (3') forms, after deformation, a bridge (3"), said bridge (3") being concave on a side facing said ceramic layer (2), and that said one metal (3) being separated from said surface of said ceramic layer (2) along said edge (5') in said border area.

5. A process according to claim 4, wherein said sub-area (3') is deformed into said bridge (3") using a stamping tool.

6. A process according to claim 1, further comprising the steps of:

deforming said one metal layer (3) by using a bending tool having at least two pairs of tool parts (18, 19, 20, 21), wherein a first pair of said at least two pairs of tool parts form a blank holder (18) and a pressure pad (19), and clamping a projecting sub-area (15) of said initial substrate (1a, 1b) projecting above said edge, with a second pair of said at least two pairs of tool parts (20, 21) by moving at least one of said at least two pairs of tool pairs relative to another of said at least two pairs of tool parts.

7. A process according to claim 6, wherein said second pair of said at least two pairs of tool parts is moved relative to said first pair of said at least two pairs of tool parts in one axial direction (A) transversely to a plane of said ceramic layer (2).

8. A process according to claim 1 wherein the other of said two metal layers (4) is attached on a side opposite said ceramic layer (2) to a carrier layer, and wherein before deformation of said sub-area (3') an opening (8) is made in said carrier layer (6) through which said deformation occurs.

9. A process for producing a ceramic-metal-substrate having a ceramic layer (2) with two metal layers (3, 4), one each disposed on each surface side of said ceramic layer which forms at least one edge (5', 14) over which one of said two metal layers projects with a sub-area, with said one of said two metal layers being a metal foil attached to said ceramic layer (2), comprising the steps of:

forming an initial substrate (1) by applying said two metal layers (3, 4) on said ceramic layer (2);

clamping said initial substrate (1) between a first pair of tool parts (10, 11) of a stamping tool at least in an area of said edge of said ceramic layer (2) such, that one of said first pair of tool parts (10) is a female die with an opening (12) and rests against a surface side of said one metal layer (3) facing away from said ceramic layer (2), by a distance from said edge (5, 14), said distance corresponding to a width of a border area (7) along said edge;

after clamping the initial substrate (1) deforming said sub-area (3') by pressing said sub-area (3') into said opening of said female die (10) by means of a male die (13) such that said one metal layer (3) is bent out of contact with said ceramic layer (2) and disposed a distance from said one surface side of said ceramic layer (2) and is raised over said one surface side of said ceramic layer, in said border area (7) of predetermined width along said edge; and with said edge formed by an interruption through the ceramic layer (2) and one of said two metal layers.

10. A process according to claim 9, wherein a copper residue, on said at least one ceramic layer (2) on aid border area is removed with an etching agent.

11. A process for producing a ceramic-metal substrate having a ceramic layer (2) with two metal layers (3, 4) one each disposed on each surface side of said ceramic layer, wherein one of said two metal layers (3) is formed by a metal foil attached to one surface side of said ceramic layer (2), comprising the steps of:

producing an initial substrate comprising said ceramic layer (2) having an opening extending through said ceramic layer (5), said two metal layers applied to surface sides of said ceramic layer (2), with said one metal layer (3) bridging said opening with a sub area and with a second of said two metal layers having an opening extending through said metal layer of said at least one, and deforming permanently said at least subarea (3') of said one metal layer (3) by a tool acting on said subarea (3) such that said subarea (3') forms, after deformation, a bridge being concave on a side facing said ceramic layer, and that said one metal layer (3) on said edge (5') is bent out of contact with said ceramic layer (2) and is disposed a distance from said one surface side of said ceramic layer (2) and is raised over said surface side over a border area (7) of predetermined width along the edge (5') of said ceramic layer (2).

12. A process according to claim 11, wherein the second metal layer (4) is attached to a carrier layer, and wherein before deformation of said sub-area (3'), an opening (8) is made in said carrier layer (6) through which said deformation occurs.

13. A process according to claim 11, wherein a copper residue, on said at least one ceramic layer (2) on said border area is removed with an etching agent.

14. A process for producing a ceramic-metal-substrate having a ceramic layer (2) with two metal layers (3, 4), one each disposed on each surface side of said ceramic layer which forms at least one edge (14) over which one of said two metal layers projects with a sub-area, with said one of said two metal layers being a metal foil attached to one surface side of said ceramic layer (2) and with said edge (14) being the border of the ceramic layer (2), comprising the steps of:

forming an initial substrate (1a) by applying said two metal layers (3, 4) on said ceramic layer (2);

clamping said initial substrate (1a) between a first pair of tool parts (18, 19) of a bending tool at least in an area of said edge of said ceramic layer such that one of said pair of tool parts (18) rests against a surface side of said one metal layer (3) facing away from said ceramic layer (2), by a distance from said edge (14), said distance corresponding to a width of a border area (14) along said edge, said bending tool having at least two pairs of tool parts (18, 19, 20, 21), wherein said first pair of said at least two pairs of tool parts form a blank holder (18) and a pressure pad (19);

clamping said sub-area projecting over said edge with a second pair of said at least two pairs of tool parts;

deforming permanently said one metal layer by moving at least one of said at least two pairs of tool parts relative to another of said at least two pairs of tool parts such that in said border area (16) of predetermined width along said edge, said one metal layer (3) is bent away from said ceramic layer (2) and disposed a distance from said one surface side of said ceramic layer (2) and is raised over said one surface side of said ceramic layer, in said border area (16) of predetermined width along said edge.

15. A process according to claim 14, wherein said second pair of said at least two pairs of tool parts is moved relative to said first pair of said at least two pairs of tool parts in one axial direction (A) transversely to a plane of said ceramic layer (2).

16. A process according to claim 14, wherein a copper residue, on said ceramic layer (2) on said border area is removed with an etching agent.

* * * * *